United States Patent [19]

Yamagata et al.

[11] Patent Number: 4,908,793
[45] Date of Patent: Mar. 13, 1990

[54] STORAGE APPARATUS INCLUDING A SEMICONDUCTOR MEMORY AND A DISK DRIVE

[75] Inventors: Hirotsugu Yamagata; Takafumi Oka; Masafumi Nozawa, all of Odawara; Shinichi Kawada, Hiratsuka, all of Japan

[73] Assignee: Hitachi, Ltd., Tokyo, Japan

[21] Appl. No.: 105,844

[22] Filed: Oct. 8, 1987

[30] Foreign Application Priority Data

Oct. 17, 1986 [JP] Japan .................. 61-245239

[51] Int. Cl.$^4$ .................. G11C 5/02; G11B 5/012; G11B 33/02
[52] U.S. Cl. .................. 365/52; 365/229; 365/228; 360/97.01; 369/75.1
[58] Field of Search .................. 365/52, 228, 229; 360/137, 97, 97.01; 364/900 MS File; 369/75.1

[56] References Cited

U.S. PATENT DOCUMENTS 3,810,116 5/1974 Prohofsky .................. 365/229
4,568,988 2/1986 McGinlay et al. .................. 360/78
4,713,756 12/1987 MacKiewicz et al. .................. 365/228

FOREIGN PATENT DOCUMENTS 0215263 10/1985 Japan .................. 365/228

OTHER PUBLICATIONS

"Nikkei Electronics", pp. 153–172 published on Sep. 23, 1985.

Primary Examiner—Glenn A. Gossage
Attorney, Agent, or Firm—Pennie & Edmonds

[57] ABSTRACT

An information recording and reproducing apparatus comprises a 3½ inch hard disk drive, a semiconductor memory connected to the 3½ inch hard disk drive for exchanging data, and a battery used to trasfer data in the semiconductor memory to the 3½ inch hard disk drive when a power supply is shut off, all of which are accommodated in a housing of the same outer dimension as that of a 5¼ inch floppy disk drive. The information recording and reproducing apparatus is replaceable with a conventional floppy disk drive and can attain high speed accessing.

3 Claims, 2 Drawing Sheets

STORAGE APPARATUS INCLUDING A SEMICONDUCTOR MEMORY AND A DISK DRIVE

BACKGROUND OF THE INVENTION

The present invention relates to a small size information recording and reproducing apparatus, and more particularly to a small size information recording and reproducing apparatus which is compact and can be accessed at a high speed.

As office automation equipment such as personal computers and word processors has become popularized, needs for small size information recording and reproducing apparatus has increased, and 3 ½ inch or 5 ¼ inch hard disk drives have been marketed. In those small size hard disk drives, a surface record density is improved year by year and a record capacity is increased through the improvement of a magnetic head and a magnetic disk, improvement of a modulation system of information to be recorded and reproduced, and improvement of a head positioning mechanism.

Since the small size hard disk drive should be replaceable with a conventional floppy disk drive, the outer dimension thereof is usually designed to be substantially equal to that of the floppy disk drive. For example, the 5 ¼ inch disk drive preferably has an outer dimension of 82.5 mm in height, 146 mm in width and 203 mm in length (full-height) to conform to a space in which two 5 ¼ inch floppy disk drives can be accommodated, or a dimension of 41 mm in height (half-height) which is one half of that of the full height in order to conform to a space in which one floppy disk drive can be accommodated. The full-height drive does not fully meet the requirement of compactness because of its double height but meets the requirement of large storage capacity.

Such a compact hard disk drive is disclosed in U.S. Pat. No. 4,568,988 and Nikkei Electronics, 9/23/85 issue, pages 153 –172.

The prior art compact hard disk drive can increase the storage capacity but it does not pay attention to the reduction of time required to record or reproduce data (access time) due to the physical movement of a magnetic head on a magnetic disk and it is not suitable for use in a system which requires a short access time such as a high class word processor, a printer having an image processor or a CAD.

SUMMARY OF THE INVENTION

It is an object of the present invention to provide a compact information recording and reproducing apparatus which eliminates the problems encountered in the prior art apparatus and can attain a short access time.

In order to achieve the above object, in accordance with the present invention, based on the observation that a volume of a disk drive such as a full-height 5 ¼ inch disk drive, preferably, a full-height 5 ¼ inch hard disk drive, is much larger than a volume of a disk drive such as a 3 ½ inch disk drive, preferably, a 3 ½ inch hard disk drive, a 3 ½ inch disk drive, a semiconductor memory for storing data of such a disk drive and a power supply battery for saving the data of the semiconductor memory to the 3 ½ inch disk drive are provided in a frame having the same volume as that of the 5 ¼ inch disk drive.

In the information recording and reproducing apparatus of the present invention, all or a portion of data on the magnetic disk are restored onto the semiconductor memory when a power is turned on and the restored data is read or written. Thus, the data can be read or written at a high speed without moving the head of the hard disk drive. During the power-on state, the battery is kept in a full charge state. When the power supply is turned off or fails, a power is supplied from the full-charged battery to the hard disk drive and the semiconductor memory and the data in the semiconductor memory is saved into the magnetic disk so that the loss of data is prevented. After the data has been saved, the supply of power from the battery is ceased and the battery is no longer discharged so that the discharge of the battery is kept minimum.

DESCRIPTION OF THE PREFERRED EMBODIMENTS

One embodiment of the present invention is explained with reference to FIGS. 1 and 2.

Figure 1:
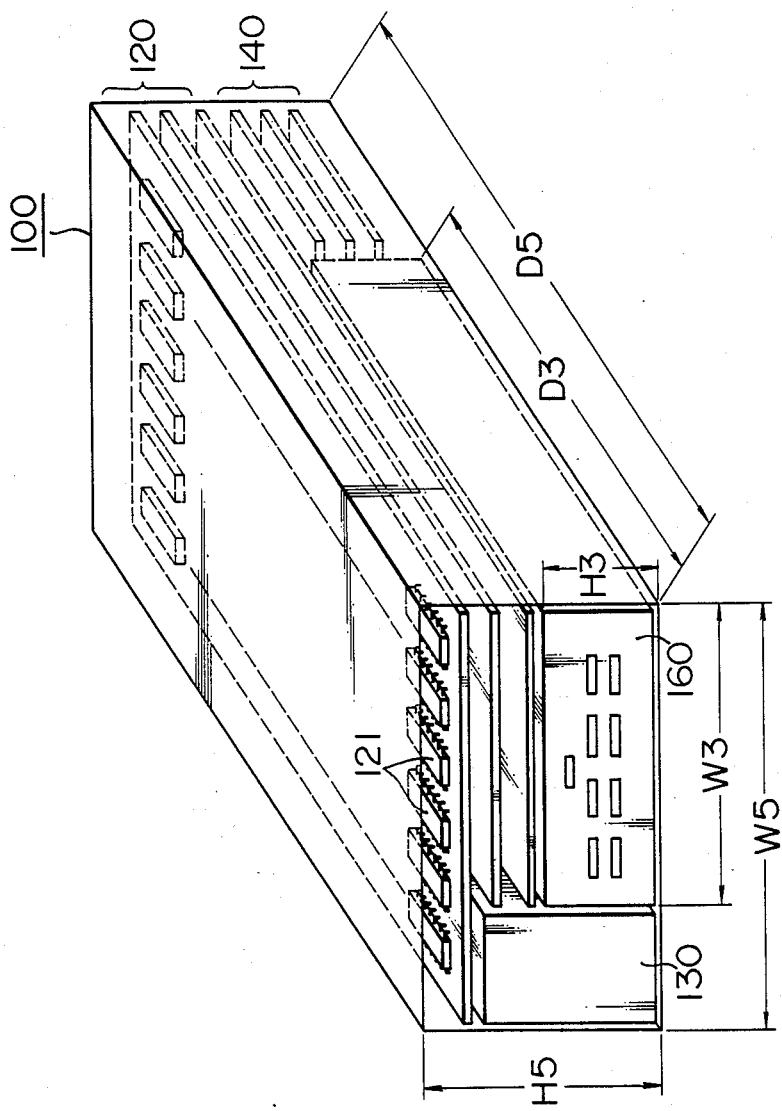
FIG. 1 shows an embodiment of an information recording and reproducing apparatus of the present invention.

In FIG. 1, an information recording and reproducing apparatus 100 has the same outer dimension as that of a full-height 5 ¼ inch hard disk drive, that is, height H5 of 82.5 mm, width W5 of 140 mm and length D5 of 207 mm. It includes therein a 3 ½ inch hard disk drive 160, a semiconductor memory unit 120 having printed circuit boards having semiconductor memory devices mounted thereon, a battery 130 used to transfer data stored in the semiconductor memory unit 120 to the 3 ½ inch hard disk drive 160 when a power supply is turned off, a power supply circuit 150 arranged behind the battery 130 (not shown in FIG. 1) for generating a power supply to be used in the information recording and reproducing apparatus 100, with the supply of a external voltage, and a peripheral circuit 140 for controlling those circuits. The 3 ½ inch hard disk drive has height H3 of 41.3 mm, width W3 of 102 mm and length D3 of 146 mm.

In the present embodiment, a front plane of the information recording and reproducing apparatus 100 is the plane defined by H5 and W5, and the apparatus is loaded such that the front plane is used as a maintenance area. For example, it is loaded such that a bottom plane, right side plane or left side plane faces a bottom plane of a host apparatus in which the present apparatus is loaded. A front plane of the 3 ½ inch hard disk drive 160, the battery 130 and the end of the semiconductor memory 120 are positioned in the front maintenance area.

A circuit configuration of the present apparatus is explained with reference to FIG. 2.

Figure 2:
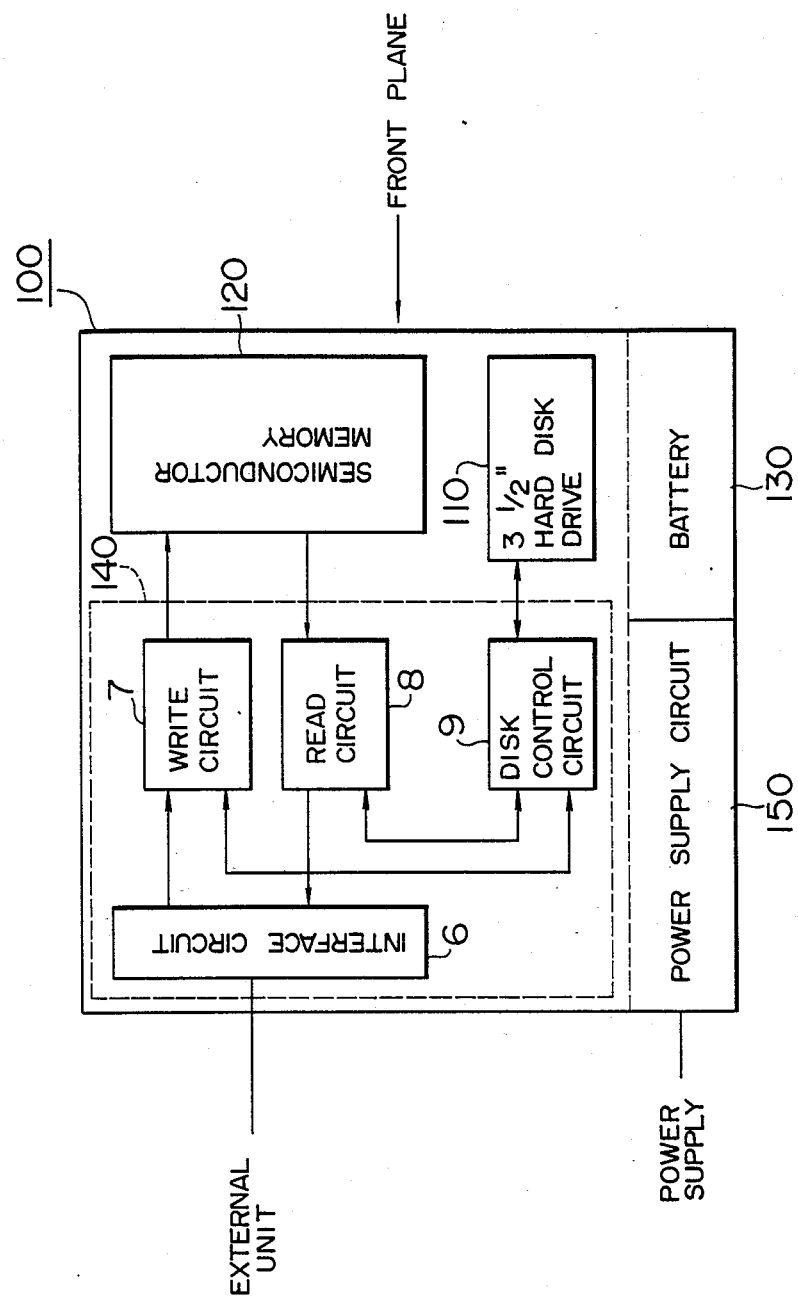
FIG. 2 shows a block diagram of a circuit of the apparatus of FIG. 1.

As shown in FIG. 2, the circuit of the present apparatus comprises semiconductor memory 120, 3 ½ inch hard disk drive 110, battery 130, power supply 150 and peripheral circuit 140 for controlling those circuits. The peripheral circuit 140 includes a write circuit 7 and a read circuit 8 for recording and reproducing data to and from the semiconductor memory 120, a disk control circuit 9 for controlling the 3 ½ inch hard disk drive 110, and an interface circuit 6 for transferring data between an external unit (or host apparatus in which the present apparatus is loaded) and the write/ read circuits 7 and 8.

In the information recording and reproducing apparatus 100 thus configured, when the apparatus is to be started up, a power supply is turned on by the host apparatus and the disk control circuit 9 reads out all or a portion of data from the 3 ½ inch magnetic disk apparatus and the write circuit 7 stores the data into the semiconductor memory 120 to prepare for data processing.

In a normal operation, when a CPU of the external unit accesses the semiconductor memory 120 to read the data, the data is read from the semiconductor memory 120 through the interface circuit 6 and the read circuit 8. When data is to be written from the external unit to the semiconductor memory 120, it is written into the semiconductor memory 120 through the interface circuit 6 and the write circuit 7.

In the normal operation, the data is thus recorded or reproduced to or from the semiconductor memory 120 through the interface circuit 6, write circuit 7 and read circuit 8. Since the recording and reproduction are done between the semiconductor memory 120 and the host apparatus, high speed processing is attained. After the recording or reproduction, the data in the semiconductor memory 120 is stored into the 3 ½ inch hard disk drive 110 through the read circuit 8 and the disk control circuit 9, and the data is thereafter retained in the disk drive 110 even if the power supply is turned off.

The storage capacity of the disk unit 110 is equal or larger than that of the semiconductor memory 120. In those operations, the power supply circuit 150 generates a voltage to drive the circuits of the present apparatus with an input power being supplied from the host apparatus in which the present apparatus is loaded. It also charges the battery 130.

If the power supply from the host apparatus is turned off during the recording or reproducing operation, the data in the semiconductor memory 120 is saved into the 3 ½ inch hard disk drive 110 through the read circuit 8 and the disk control circuit 9 as the power is supplied from the battery 130.

Since a time required to save the data may be, for example, 30 seconds, the battery 130 may be a relatively compact one which can supply power for that period.

When the storage capacity of the semiconductor memory 120 is smaller than that of the 3 ½ inch hard disk drive 110, a portion of the data on the 3 ½ inch hard disk is not transferred to the semiconductor memory 120 but is left on the hard disk. When the external unit accesses the data left on the hard disk, it accesses through the disk control circuit 9 and the write circuit 7 or the read circuit 8 and the interface circuit 6.

In accordance with the present embodiment, the compact 3 ½ inch hard disk drive and the semiconductor memory are arranged in the full-height size case which is equal to the size of the 5 ¼ inch hard disk drive, and the recording and reproduction of data to and from the host apparatus are done with the semiconductor memory. As a result, fast access speed is attained. Particularly, the access time is approximately 0.8 ms which is about 1/100 of that of the prior art apparatus. Further, in the present embodiment, a battery having a durability of approximately 2 –3 years which is shorter than a durability of the hard disk drive (approximately 10 years) is arranged in the front plane of the apparatus so that it can be replaced in the loaded state of the apparatus. Thus, the maintainability is improved.

We claim:

1. A storage apparatus comprising:
   a housing having the approximate dimensions of 82.5 mm in height, 146 mm in width, and 203 mm in length;
   a ½ inch disk drive accommodated in said housing;
   a semiconductor memory accommodated in said housing and connected to said disk drive;
   a control circuit to control said disk drive and semiconductor memory accommodated in said housing; and
   a battery accommodated in said housing for supplying power to said storage apparatus after a power supply of said storage apparatus has been shut off or fails, so as to provide uninterrupted supply of power to said storage apparatus and enable data stored in said semiconductor memory to be transferred to a disk in said disk drive.

2. A storage apparatus according to claim 1 further comprising power supply means accommodated in said housing for generating the power to be supplied to said storage apparatus, and said battery is charged by said power supply means.

3. A storage apparatus according to claim 1 wherein said battery is arranged at a position in said housing which position allows said battery to be handled from outside of said storage apparatus.

* * * * *

UNITED STATES PATENT AND TRADEMARK OFFICE
CERTIFICATE OF CORRECTION

PATENT NO. : 4,908,793
DATED : March 13, 1990
INVENTOR(S) : Yamagata et al.

It is certified that error appears in the above-identified patent and that said Letters Patent is hereby corrected as shown below:

Column 4, Line 25 Change "1/2" to --3 1/2--.

Signed and Sealed this

Thirtieth Day of July, 1991

*Attest:*

HARRY F. MANBECK, JR.

*Attesting Officer*      *Commissioner of Patents and Trademarks*